United States Patent [19]

Chan et al.

[11] Patent Number: 4,553,314

[45] Date of Patent: Nov. 19, 1985

[54] METHOD FOR MAKING A SEMICONDUCTOR DEVICE

[75] Inventors: Tsiu C. Chan, Carrollton; Chao Mai; Myint Hswe, both of Dallas, all of Tex.

[73] Assignee: Mostek Corporation, Carrollton, Tex.

[21] Appl. No.: 431,527

[22] Filed: Sep. 30, 1982

Related U.S. Application Data

[60] Division of Ser. No. 351,726, Feb. 24, 1982, abandoned, which is a continuation of Ser. No. 100,606, Dec. 5, 1979, abandoned, which is a division of Ser. No. 2,426, Jan. 10, 1979, abandoned, which is a continuation of Ser. No. 762,398, Jan. 26, 1977, abandoned.

[51] Int. Cl.[4] .......................................... H01L 21/22
[52] U.S. Cl. .................................... 29/571; 29/578; 148/187
[58] Field of Search ............... 29/571, 578; 148/187, 148/105; 156/657, 662, 653

[56] References Cited

U.S. PATENT DOCUMENTS

| | | | |
|---|---|---|---|
| 3,892,891 | 7/1975 | Goodman et al. | 156/662 X |
| 3,898,105 | 8/1975 | Mai et al. | 148/1.5 |
| 3,899,363 | 8/1975 | Dennard et al. | 148/1.5 |
| 3,913,211 | 10/1975 | Seeds et al. | 29/578 X |
| 3,996,658 | 12/1976 | Takei et al. | 29/578 X |
| 4,179,311 | 12/1979 | Athanas | 148/1.5 |

FOREIGN PATENT DOCUMENTS 1421363 1/1976 United Kingdom .
1428713 3/1976 United Kingdom .

Primary Examiner—George T. Ozaki

[57] ABSTRACT

A method for making a semiconductor device is described in which overlapping polycrystalline silicon layers are deposited over selected portions of a semiconductor substrate and insulated from the substrate and from each other, thereby providing an improved semiconductor device for use in a random-access memory integrated circuit.

5 Claims, 30 Drawing Figures

METHOD FOR MAKING A SEMICONDUCTOR DEVICE

This is a division of application Ser. No. 351,726 filed Feb. 24, 1982, now abandoned, which is a continuation of application Ser. No. 100,606, filed Dec. 5, 1979, now abandoned, which is a division of application Ser. No. 002,426 filed Jan. 10, 1979, now abandoned, which is a continuation of application Ser. No. 762,398 filed Jan. 26, 1977, now abandoned.

BACKGROUND OF THE INVENTION

The present invention relates generally to semiconductor devices, and more particularly to field-effect elements such as field-effect transistors (FET) and memory cells for use in random-access memory (RAM) integrated circuits.

The integrated circuit art strives for improvements in processing techniques for reducing the size of circuit elements and improving device yields. The present invention is directed to a number of related problems inherently involved in making high density RAMs.

In particular, it has been found that the formation of thick field oxide layers in selected areas of a substrate using prior art isoplanar techniques causes the undesirable transportation of silicon nitride into portions of the substrate from silicon nitride layers used to delineate the field oxide growth. The present invention provides steps which alleviate such nitride contamination of the substrate.

An aspect of prior art processes which limits the number of elements per unit area on a semiconductor chip is the use of deposited oxide as a mask for etching underlying layers. Deposited oxide tends to be lumpy and uneven in thickness, which hinders precise mask formation thereby affecting tolerances and limiting element density. The present invention overcomes the limitations of deposited oxide masks.

Additionally, a troublesome prior art problem solved by the present invention is lateral etching of oxide layers under polycrystalline silicon gate layers incident to opening diffusion windows to the device substrate. The resulting oxide undercut of such gate layers can cause device failure by a short circuit between a gate layer and the substrate. Prior art methods of depositing oxide to fill in the undercut have proved to be unreliable.

Another troublesome prior art problem solved by the present invention is extensive lateral etching of stabilization layer oxides incident to opening contact windows in devices which employ such stabilization layers. It has been a practice in the prior art to deposit a relatively thick layer of doped oxide over a relatively thin layer of essentially undoped thermally grown oxide for the known purpose of preventing contaminants such as sodium from migrating into the substrate. When contact windows are subsequently opened by etching through a photoresist mask, the doped oxide (i.e., the stabilization layer) etches laterally under the mask by a substantial amount by virtue of the disparity in etch rates of doped deposited oxide and undoped grown oxide. Doped deposited oxide (particularly the "low temperature" variety deposited at about 400° C.) typically etches about ten times as fast as undoped grown oxide. Since the etch duration must be long enough to penetrate through the underlying grown oxide layer, the amount of lateral etch of the doped deposited oxide under the mask is typically somewhat greater than ten times the thickness of the undoped grown oxide. It will be appreciated tha whatever amount of planned overetching is included in the duration aggravates this problem. Clearly, the element density per unit of chip area is adversely affected by such extensive lateral etching. Process steps are provided in the present invention which substantially eliminate this problem.

SUMMARY OF THE INVENTION

In accordance with the present invention, a method for making a semiconductor device is disclosed in which various types of field-effect elements may be formed simultaneously by a sequence of process steps which may be advantageously applied in making high element density integrated circuits.

In accordance with an important embodiment, two basic field-effect elements (a memory cell and a field-effect transistor) are illustrated in juxtaposition in various sequential stages in a process for making an integrated circuit device of the invention.

In accordance with an important feature of the invention, a method for preparing a substrate surface of a semiconductor device is disclosed which comprises: defining an active area in the substrate, growing a thin oxide layer in the active area to a thickness sufficient to remove substrate surface damage, and removing the thin oxide layer to provide a clean substrate surface in the active area.

In accordance with another important feature of the invention, a method for forming layers of polycrystalline silicon (hereinafter referred to as polysilicon) in precise patterns and locations over a semiconductor substrate is disclosed which comprises: partially oxidizing a polysilicon layer, and removing portions of the resulting polyoxide layer to form a mask for etching the underlying polysilicon layer. The term "polyoxide" is used herein to describe the material formed by the oxidation of polysilicon.

In accordance with another important feature of the invention, a method for making a semiconductor device is disclosed which comprises: using a polysilicon layer as a mask for etching an underlying oxide layer to expose a substrate surface portion, diffusing dopants into the substrate, and exposing the device to an oxidizing ambient to fill in undercut portions of the oxide layer incidentally caused by lateral etching thereof under peripheral edges of the polysilicon layer.

In accordance with another important feature of the invention, a method for forming very small contacts in an integrated circuit device is disclosed which comprises: opening contact windows in undoped oxide layers prior to stabilizing the device surfaces, thereby minimizing the lateral etching problem of the prior art.

The novel features believed characteristic of the invention are set forth in the appended claims. The nature of the invention, however, as well as its essential features and advantages, may be understood more fully upon consideration of an illustrative embodiment, when read in conjunction with the accompanying drawings, wherein:

DESCRIPTION OF THE PREFERRED EMBODIMENTS

Figure 1:
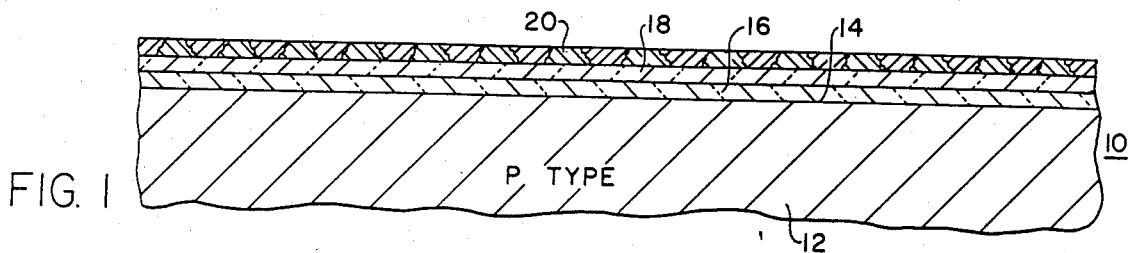
FIGS. 1–20 are schematic sectional views illustrating portions of an integrated circuit device of the present invention at various stages in a process for making the device.

Referring to FIG. 1 there is shown a schematic cross-section of a portion of an integrated circuit device of the present invention, indicated generally by the reference numeral 10, at an early stage in a manufacturing process. The device 10 comprises a substrate 12 which is typically monocrystalline silicon of a conventional crystal orientation known in the art. Many features of the present invention are applicable to devices employing semiconductor materials other than silicon as will be appreciated by those skilled in the art. The substrate 12 maybe either P-type or N-type; however, for purposes of this illustrative embodiment, P-type conductivity is employed, a preferred resistivity being about 5 to 25 ohm-cm in the substrate 12. Thermally grown on top surface 14 of the substrate 12 is a silicon dioxide layer 16, having a preferred thickness of about 600 Angstroms. A silicon nitride layer 18, having a preferred thickness of about 600 Angstroms, is deposited on thermal oxide layer 16 in a reactor in a known manner. A top layer 20 of polysilicon having a thickness of about 1000 Angstroms is deposited on nitride layer 18 using known deposition techniques.

Figure 2:
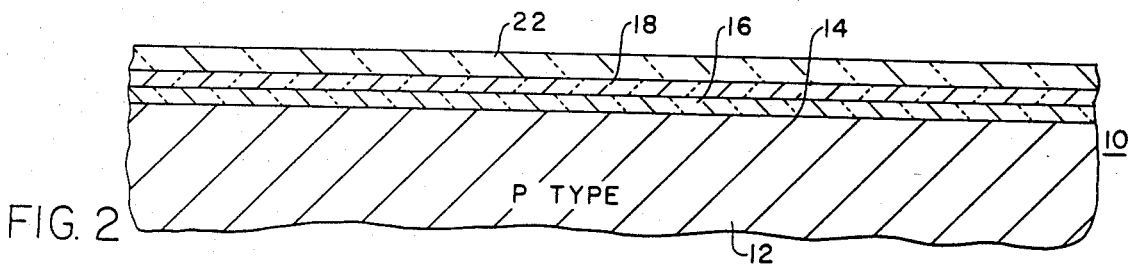

The device 10 is then exposed to an oxidizing ambient preferably in steam between about 900° C. to 1000° C. for a sufficient period of time to completely oxidize the polysilicon layer 20 of FIG. 1, thereby producing a polyoxide layer 22 as shown in FIG. 2. The polyoxide layer 22 is about 2000 Angstroms thick, which is about twice the thickness of the original polysilicon layer 20 due to growth during oxidation.

Figure 3:
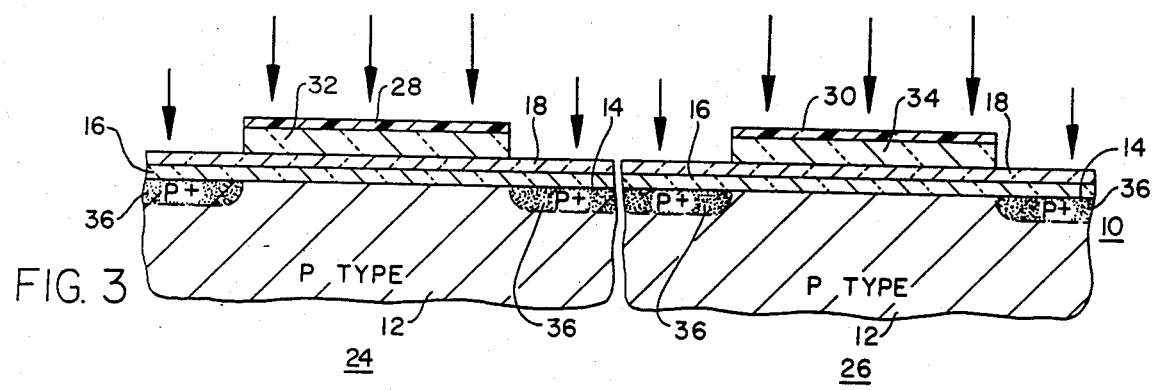

Referring to FIG. 3, representative portions of device 10 are shown after several intermediate steps have been performed. While two distinct component segments or element sites 24 and 26 are explicitly illustrated in FIG. 3, it is to be understood that they are representative of a great many similar sites (not shown) wherein similar elements are simultaneously produced in accordance with the description of the inventive process which follows. At both sites 24 and 26, photoresist patterns 28 and 30 have been deposited on polyoxide layer 22 using standard photomasking techniques, after which the unmasked portions of layer 22 are etched away using an etchant which selectively attacks oxide thereby leaving polyoxide portions 32 and 34 as shown. Following the etching step, an ion implant step is performed in a known manner as indicated by the arrows, preferably using boron, to produce P+ regions 36, which penetrate to a depth of about 2000 Angstroms in the portions of the substrate 12 not covered by polyoxide (also referred to as the "field area" of the device 10). The energy of the ions is selected so asto penetrate only through the portions of layers 16 and 18 not covered by photoresist and polyoxide. An intensity of about $1.6 \times 10^{13}$ boron ions/cm$^2$ is preferably used in accordance with known techniques as, for example, by means of the techniques described in U.S. Pat. No. 3,898,105, hereinafter cited as Mai et al. Whatever technique is used, however, it is preferred that P+ regions 36 have a resistivity of about one ohm-cm in the areas of highest impurity concentration in the final device.

Figure 4:
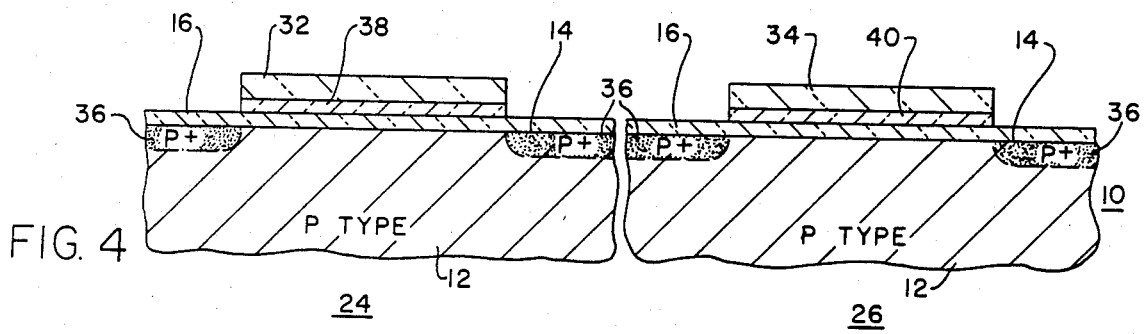

Next, the photoresist layers 28 and 30 are removed and the portions of the nitride layer 18 not covered by the polyoxide layer portions 32 and 34 are selectively etched away using known techniques, thereby leaving nitride portions 38 and 40 as shown in FIG. 4.

Figure 5:
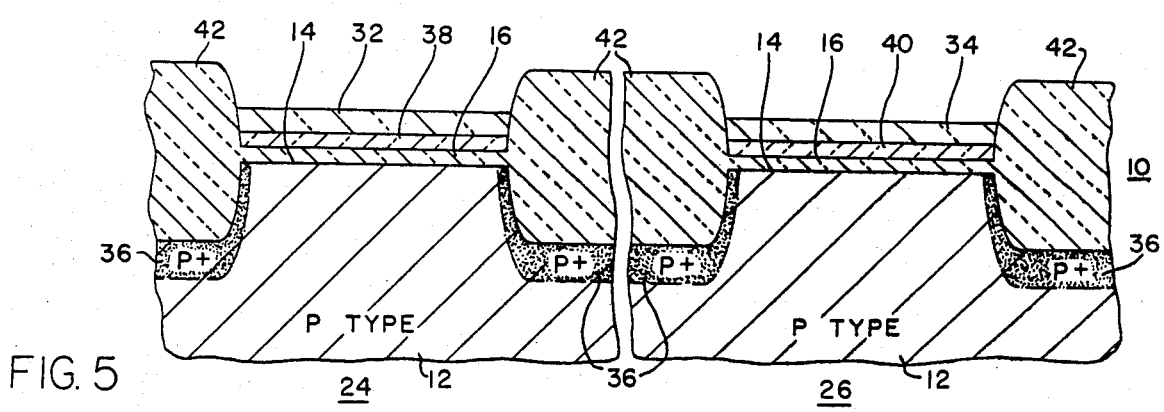

Now referring to FIG. 5, an oxidation is performed in steam for about 6 to 8 hours at approximately 1000° C., which results in the growth of a relatively thick "isoplanar field oxide" layer 42, preferably of about 14,000 Angstroms in thickness, in the portions of the substrate 12 not covered by silicon nitride. The field oxide 42 penetrates into the substrate 12 to a depth of about 7000 Angstroms, the oxidation process driving the boron implant regions 36 to a greater depth therebelow. The P+ regions 36 permit the use of a thinner field oxide 42 by reducing the resistivity thereunder.

Figure 6:
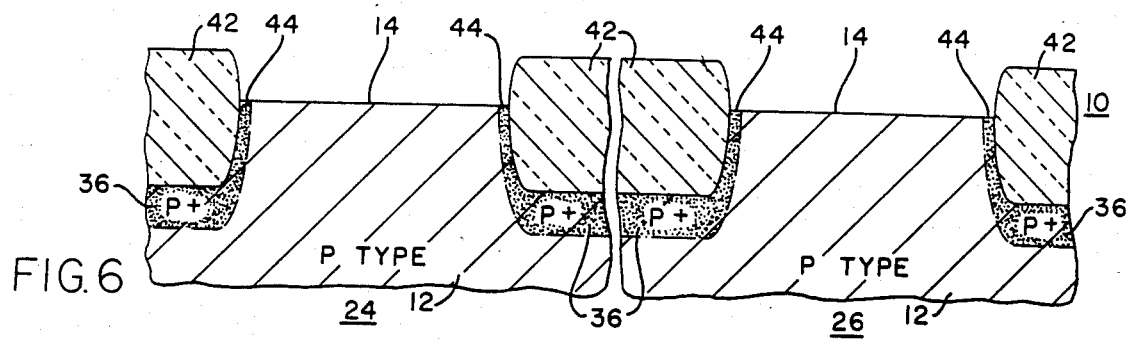

Next, the polyoxide layers 32 and 34 are removed by means of etching with hydrofluoric acid in a known manner, which also slightly reduces the thickness of the field oxide 42. Then, the nitride layers 38 and 40 and the remaining portions of oxide layer 16 are removed using conventional techniques, which produces the structure shown in FIG. 6.

Figure 7:
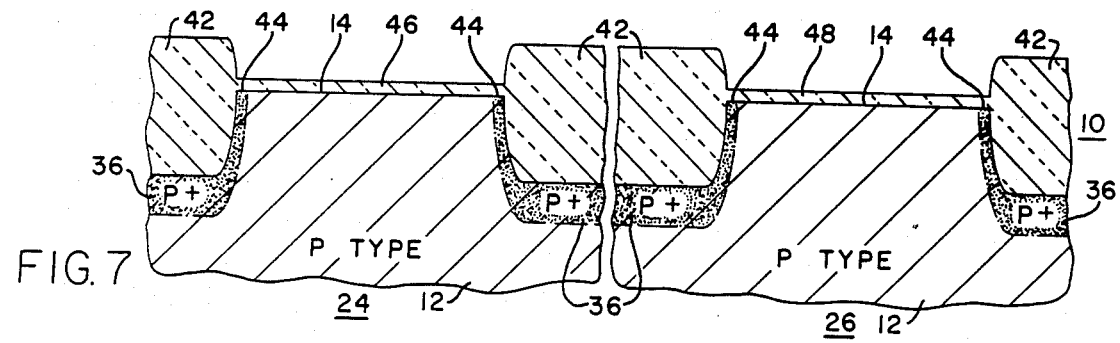

Various surface "cleaning" steps are ordinarily used at this point in prior art processes to remove surface damage in the active area of the device. By "active area" is meant those portions of the device where no field oxide has been grown. It has been found, however, that merely cleaning by etching some of the substrate 12 along surface 14 is inadequate to remove silicon nitride contamination which exists along edges 44 of the substrate 12 near the field oxide 42. Small amounts of silicon nitride from layers 38 and 40 are transported to the substrate surface 14 at the edges of the field oxide 42 incident to the chemical process which produces the field oxide 42. Accordingly, an oxidation step is performed, preferably in an ambient atmosphere of hydrogen chloride and oxygen, to produce thermal oxide layers 46 and 48 as shown in FIG. 7, thereby gathering the nitride impurities at edges 44 from the substrate 12 into the oxide as it grows. A thickness of about 300 Angstroms is sufficient for oxide layers 46 and 48, with a preferred thickness being between 300 and 1000 Angstroms.

Figure 8:
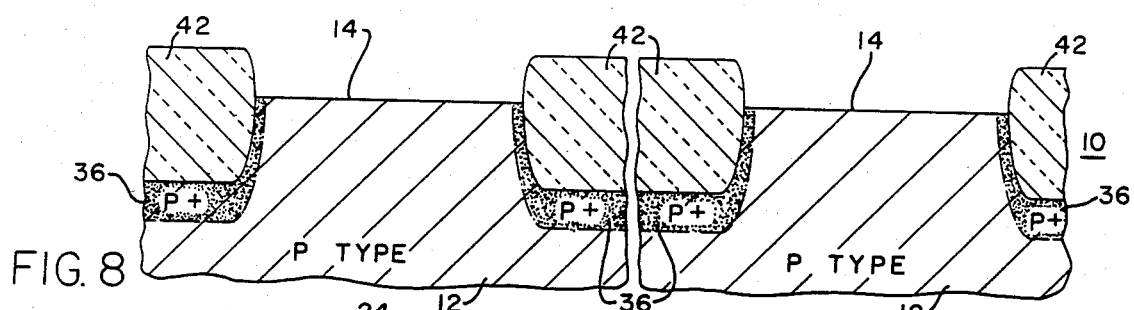

Next, the oxide layers 46 and 48 are etched away to produce the structure of FIG. 8. It will be appreciated by those skilled in the art that good surface conditions are important to the operation of field-effect device elements, and particularly in the channel of an enhancement mode FET. In accordance with an important feature of the present invention, the oxidizing and etching steps of FIGS. 7 and 8 are effective to remove surface damage (generally occuring in the top 20 to 30 Angstroms of the substrate 12) as well as the silicon nitride contamination, thereby providing the clean, impurity-free surface portions 14 shown in FIG. 8.

As a result of the successive etching steps to remove oxide layers 16, 32, 34, 46, and 48 in the steps shown from FIGS. 5 through FIG. 8, the field oxide 42 is somewhat reduced in thickness. At the process stage shown in FIG. 8, the field oxide has an overall thickness of about 10,000 Angstroms, with about 7000 Angstroms extending to a level below the level of surface 14 and about 3000 Angstroms extending above the level of surface 14.

Figure 9:
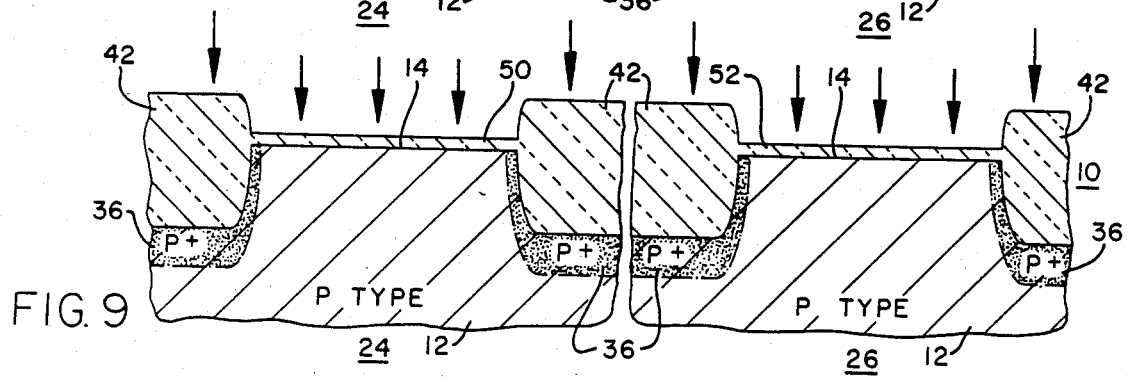

Next, thermal oxide layers 50 and 52 are grown to a thickness of about 900 Angstroms as shown in FIG. 9. A light dose boron ion implantation is then performed using known techniques as indicated by the arrows for purposes of threshold voltage adjustment of the field-effect elements which will be formed subsequently in sites 24 and 26.

Figure 10:
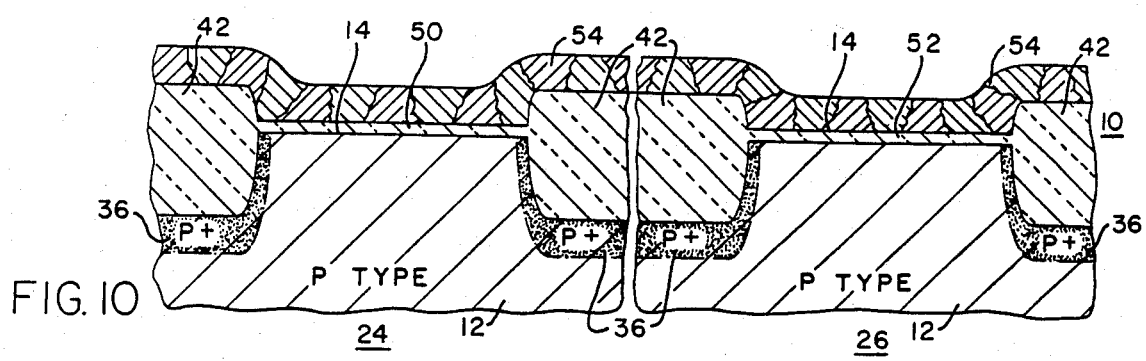
Figure 11:
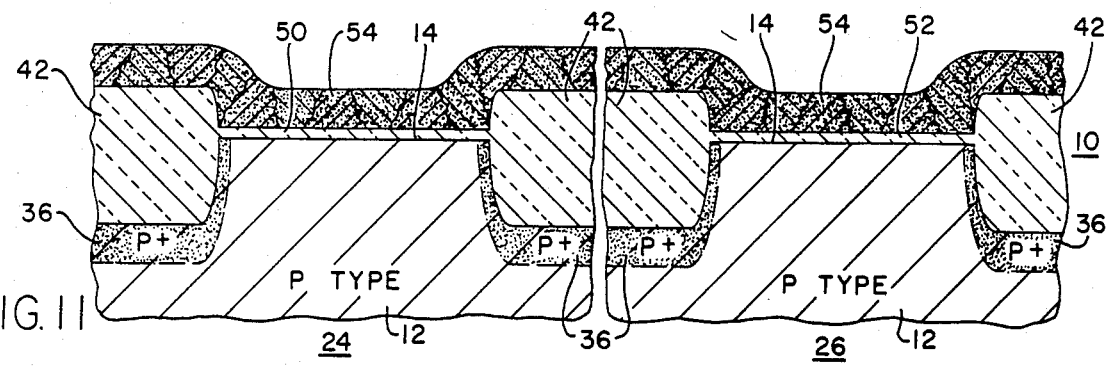

Now referring to FIG. 10, a polysilicon layer 54 is deposited as shown over the entire device 10 to a thickness of about 6000 Angstroms using known techniques. In order to make layer 54 become highly conductive, it is then heavily doped N-type, preferably using phosphorus diffusion as represented by the stippling of polysilicon layer 54 in FIG. 11.

Figure 12:
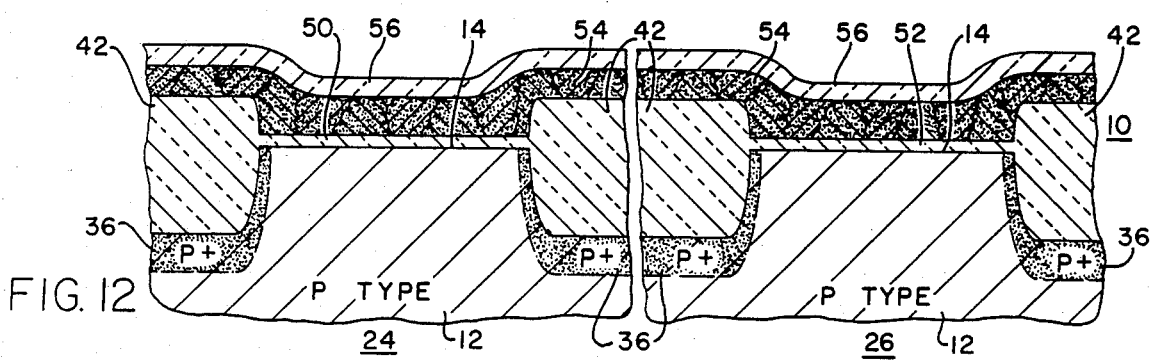

Next, a top portion 56 of layer 54 is oxidized to produce the structure shown in FIG. 12. Polyoxide layer 56 has a preferred thickness between about 2,500 and 5,000 Angstroms, the formation of which causes a corresponding reduction in the thickness of polysilicon layer 54 to between about 3500 and 4800 Angstroms. It is presently preferred, however, that layers 54 and 56 both be about 4000 Angstroms thick.

Figure 13:
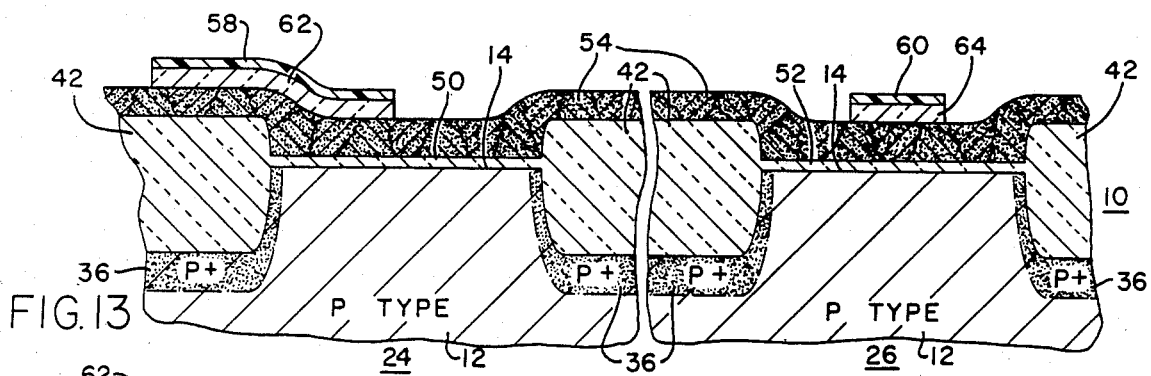

FIG. 13 illustrates device 10 after masking and etching steps have been performed wherein photoresist patterns 58 and 60 are formed, and the portions of polyoxide layer 56 not covered by photoresist are etched away leaving polyoxide portions 62 and 64. Optionally, another light dose implant may be performed at this stage for fine adjustment of the threshold of the field-effect element to be formed in site 24.

Figure 14:
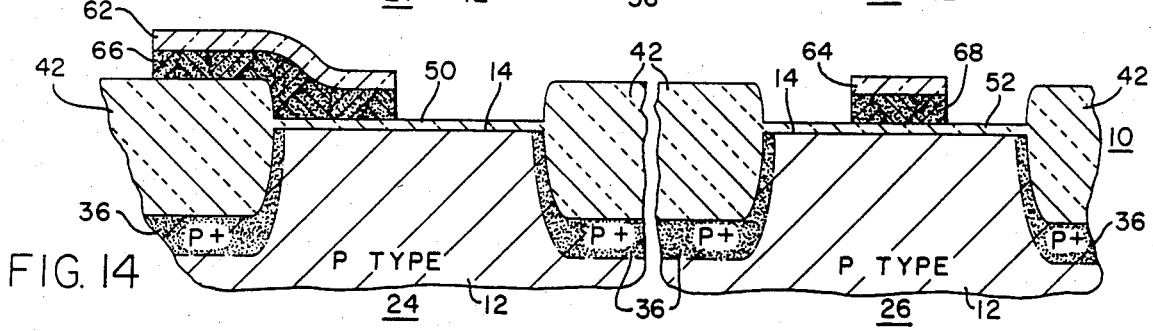

Now referring to FIG. 14, the photoresist has been removed leaving the polyoxide layer portions 62 and 64 as masks for etching away portions of polysilicon layer 54. At similar sites of the device 10 of which sites 24 and 26 are representative, similar polyoxide masks also exist so that etching produces a plurality of separate polysilicon layers in the device 10 of which layers 66 and 68 are representative. The polysilicon layer 66 overlies a portion of thermal oxide layer 50 and extends over an adjacent portion of field oxide layer 42 as shown at element site 24. The polysilicon layer 68 overlies a center portion of thermal oxide layer 52 in the element site 26 as shown in FIG. 14.

The use of polyoxide portions 62 and 64 as masks for etching the underlying polysilicon has advantages over prior art deposited oxide mask in that polyoxide growth produces a highly regular layer having a slower, more controllable etch rate. Such properties of polyoxide enable a high degree of mask definition to be carried through from the photoresist mask (layers 58 and 60 in FIG. 13) to the polyoxide mask (layers 62 and 64 in FIG. 14). The high degree of mask definition is further carried through in the formation of polysilicon layers 66 and 68. By "high definition" is meant "positioned with a higher degree of precision" compared to prior art techniques using deposited oxide masks. The polysilicon layer 68 will be seen later in the process to further serve as a mask for etching the underlying oxide layer, thereby aligning itself over a channel region of a field-effect transistor. The technique of using a polysilicon layer as a mask for producing a self-aligned gate FET is known, the structure also being referred to in the art as a "silicon-gate" FET. The precision (or tolerance) in positioning layers 66 and 68 has a direct bearing on the degree of element density capable of formation in the integrated circuit device 10.

Figure 15:
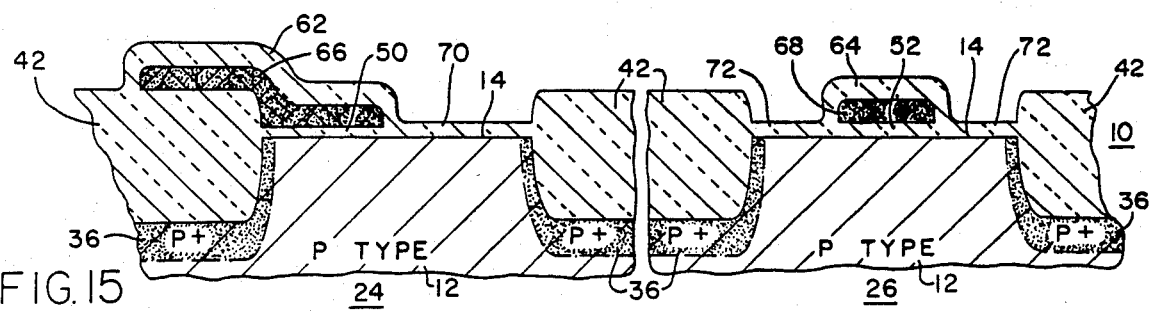

An oxidation step is now performed on the structure of FIG. 14 to cover the exposed edges of polysilicon layers 66 and 68 with polyoxide as shown in FIG. 15. Thermal oxide portions 50 and 52 remain at a thickness of about 900 Angstroms, while uncovered thermal oxide portions 70 and 72 increase the thickness to about 1,500 to 2,000 Angstroms. Polyoxide layers 62 and 64 grow from a minimum of 2500 Angstroms to a thickness of at least about 3,000 Angstroms, which again reduces layers 66 and 68 slightly in thickness.

Figure 16:
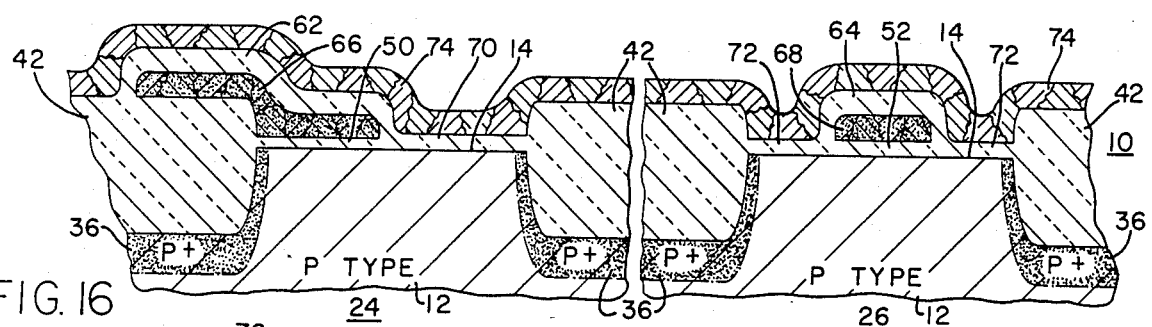

A new polysilicon layer 74 is now deposited over the device 10 as shown in FIG. 16 using known deposition techniques in similar fashion to the deposition step of FIG. 10. The layer 74 has a preferred thickness of about 4,000 Angstroms.

Figure 17:
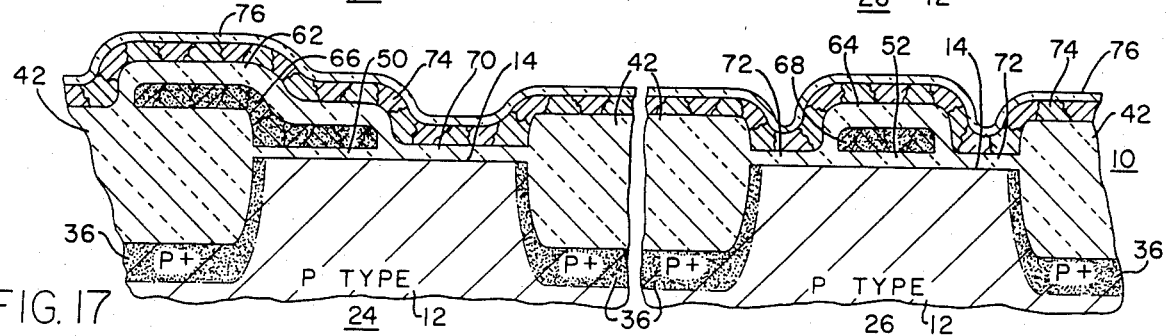

Next a partial oxidation of polysilicon layer 74 is performed to produce a polyoxide layer 76 having a thickness of about 1,000 Angstroms as shown in FIG. 17. The oxidation reduces polysilicon layer 74 to a thickness of about 3,500 Angstroms.

Figure 18:
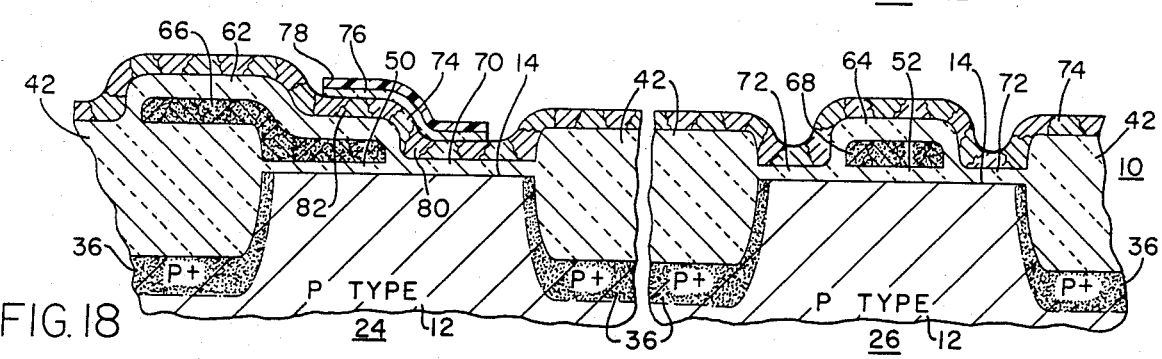

Now referring to FIG. 18, the device 10 is shown after a photoresist pattern 78 has been used to mask polyoxide layer 76, which is etched away entirely at site 26 and partially at site 24. The remaining polyoxide 76 overlies both a lower portion 80 and an upper portion 82 of polysilicon layer 74 at site 24.

Figure 19:
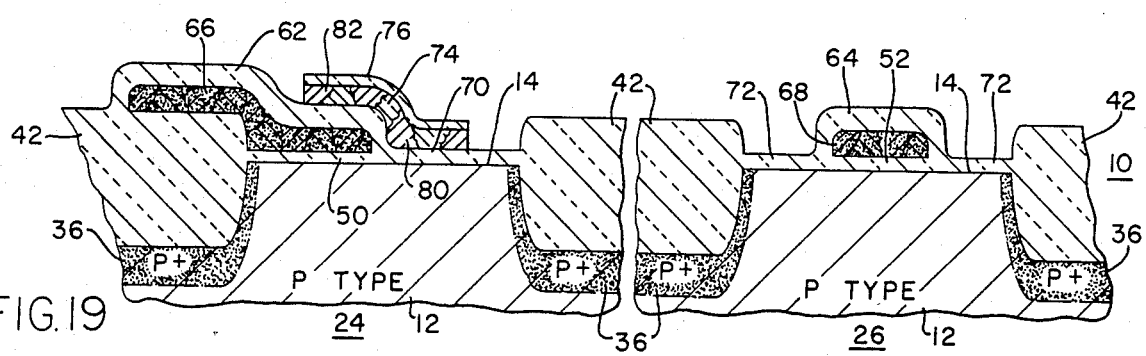

Referring to FIG. 19, the photoresist has been removed and the remaining polyoxide 76 has been used as a mask to etch polysilicon layer 74, thereby removing layer 74 entirely from site 26 and partially from site 24 to produce the structure shown.

It will be seen that the process steps for producing the second polysilicon layer 74 as illustrated in FIGS. 16–19 are essentially the same (aside from thickness variations) as the process steps for producing the first polysilicon layer 66 as illustrated in FIGS. 10–14, except that layer 74 remains undoped at the stage of the process shown in FIG. 19. For purposes of this specification, the term "undoped" means "essentially free of conductivity affecting impurities" such as phosphorus (N-type), boron (P-type) and their known functional equivalents.

It will also be appreciated that the arrangement of polysilicon layers 66 and 74 enables elements of the type shown in site 24 to be arranged in a dense manner in device 10. In particular, by overlapping the field oxide 42 with layer 66 and likewise overlapping layer 66 with layer 74, interconnections between adjacent cells (not shown) are facilitated, and the formation of contacts in subsequent steps is not a limiting factor in choosing the amount of active surface area 14 allocated to element 24.

Next, an etch is performed which selectively removes a portion of polyoxide layer 70 to expose a portion of surface 14 in the area of site 24 not covered by polysilicon and removes polyoxide layer 72 to expose portions of surface 14 in the area of site 26 not covered by polysilicon. Thereafter, an N-type dopant, preferably phosphorus, is diffused using known techniques whereby thermal oxide layers 50, 52 and 70 act as diffusion masks in producing N+ regions 86, 88, and 90 in the substrate 12, to a depth of about 15,000 Angstroms below surface 14 in accordance with the structure of FIG. 20. The phosphorus also diffuses into the top polysilicon layer 74 (as indicated by the stippling), which causes layer 74 to be heavily doped N-type and thus highly conductive. In an alternative embodiment using an N-type substrate, a P-type diffusion, typically using boron, would be performed at this stage to produce the complementary conductivity-type structure of that shown herein.

Figure 20:
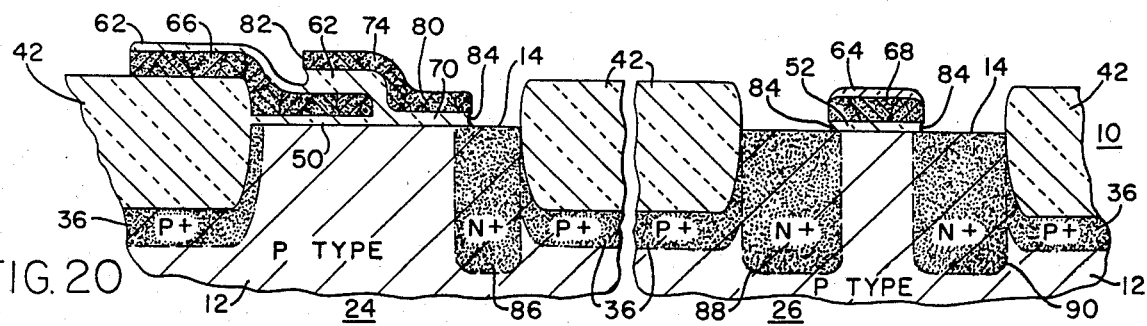

In order to be sure that no thermal oxide is left on surface 14 where the diffusion is to be performed, it is general practice to over etch somewhat causing a significant amount of lateral etching or undercutting which can be the source of problems in the areas identified by numeral 84. Precise control of the etch duration will minimize the amount of undercutting, which may result in a small amount of polyoxide layers 62 and 64 being left over polysilicon layers 66 and 68 as shown in FIG. 20. In any event, the etched duration must be long enough to remove all oxide from polysilicon layer 74 and from the portions of surface 14 above the diffused regions 86, 88 and 90 to permit the N-type dopants to diffuse therein.

Figure 21:
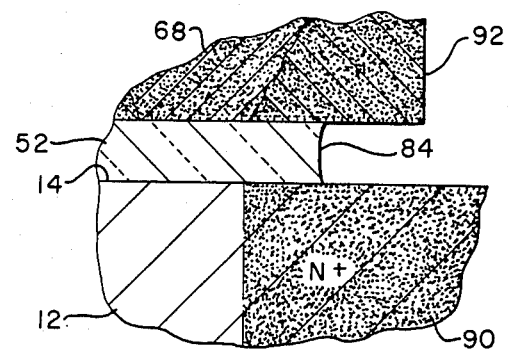
FIG. 21 is an enlarged view of a representative portion of FIG. 20.

The enlarged view of FIG. 21 shows in greater detail, a typical underctu area 84, such as the area under polysilicon layer 68, where thermal oxide layer 52 has been laterally etched to a distance from peripheral edge 92 of polysilicon layer 68, which distance is typically somewhat greater than the thickness of thermal oxide layer 52.

Figure 22:
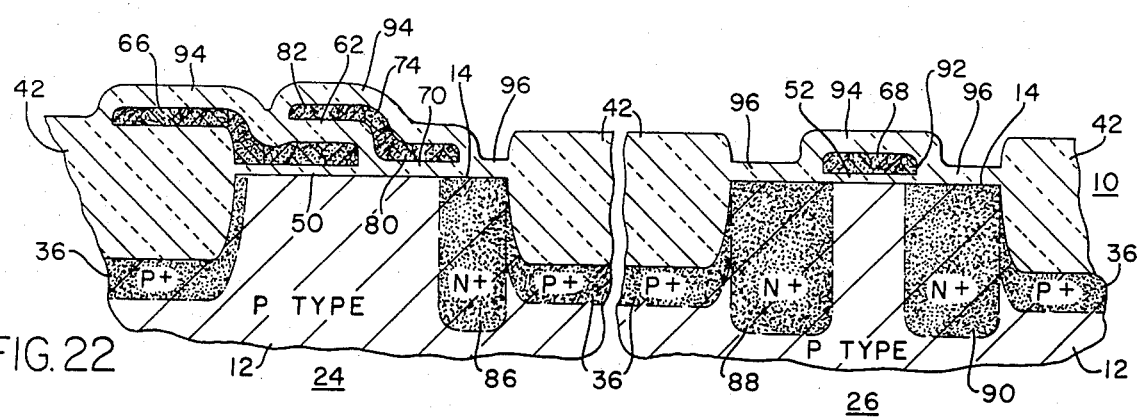
FIG. 22 is a schematic sectional view illustrating a succeeding step in the process.
Figure 23:
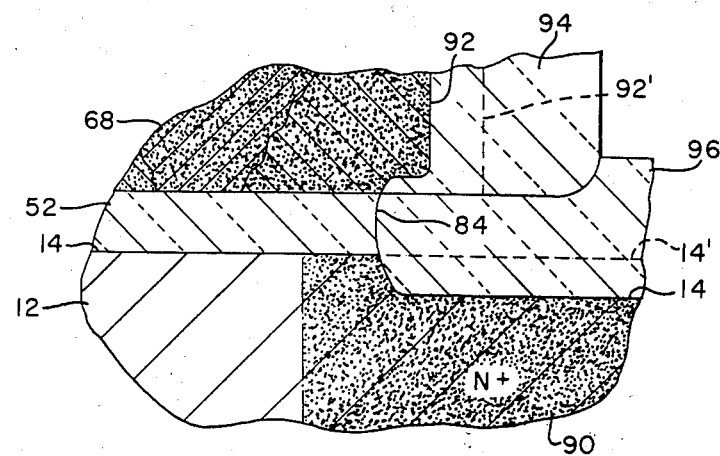
FIG. 23 is an enlarged view of a representative portion of FIG. 22.

Now referring to FIGS. 22 and 23, the device 10 is placed in a furnace with dry oxygen or steam at about 900° C. to 1000° C. so that oxide layers of about 2000 Angstroms are grown over the various polysilicon layers as indicated by numerals 94, and over the various N+ regions in the substrate 12 as indicated by numerals 96. The oxidation is effective to fill in the undercut portions 84 as illustrated more clearly in the enlarged view of FIG. 23. The position of the peripheral edge of polysilicon layer 68 prior to oxidation is indicated by the dashed line 92'. The growth of polyoxide layer 94 has the effect of moving the peripheral edge 92 of polysilicon layer 68 slightly to the left in the view of FIG. 23. In addition, growth of thermal oxide layer 96 moves the substrate surface 14 downward from its original position 14'.

Figure 24:
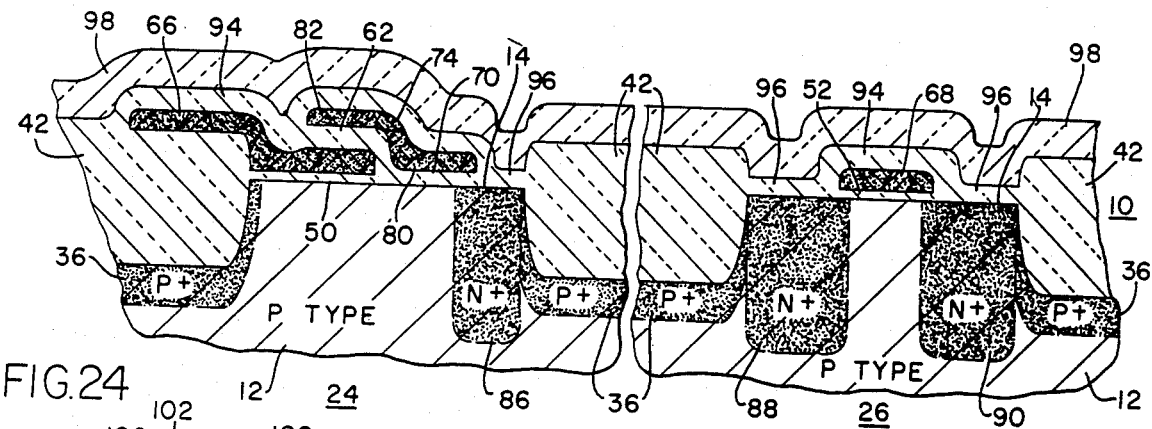
FIGS. 24 and 25 are schematic sectional views illustrating succeeding steps in the process.

Now referring to FIG. 24, a layer 98 of "high temperature" undoped oxide is deposited, preferably using $SiH_4$ and $CO_2$ is a known manner, at a temperature between 600° C. and 1000° C. to a thickness of preferably about 6,000 Angstroms. At a corresponding stage, prior art processes typically deposit a "low temperature" oxide in a range of 350° C. to 450° C., which has a relatively fast etch rate causing extensive undercutting problems as discussed above in the background. The present invention provides a deposited undoped oxide layer 98 which has an etch rate comparable to that of underlying grown oxide layers 94 and 96. Most preferably, oxide layer 98 is deposited by placing the device 10 in a conventional RF reactor and heating the device to about 900° C. or 950° C. to cause the reaction: $SiH_4 + 2CO_2 \rightarrow SiO_2 + 2CO + 2H_2$.

In accordance with an additional feature of the invention, it will be appreciated that layer 98 is a redundant oxide layer which covers possible defects such as "pin holes" in the underlying oxide layers 94 or 96.

Figure 25:
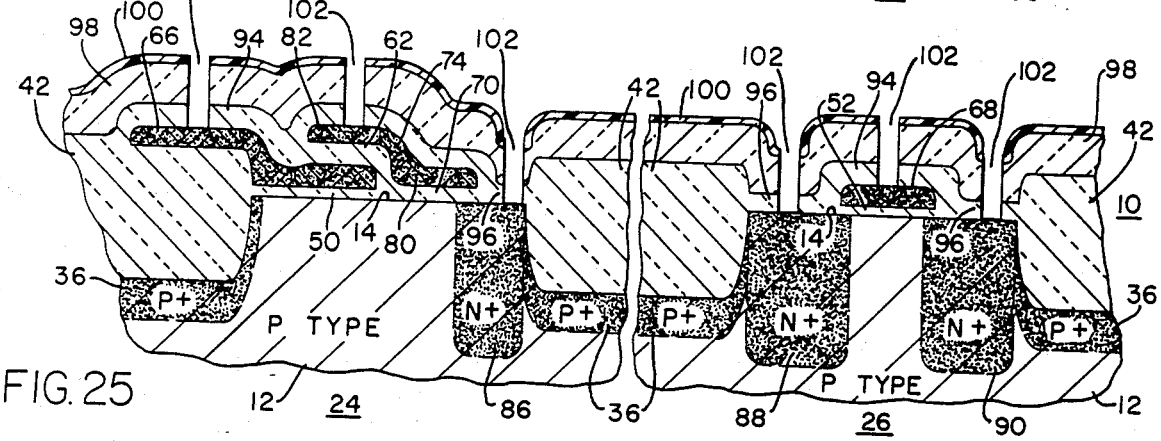
Figure 26:
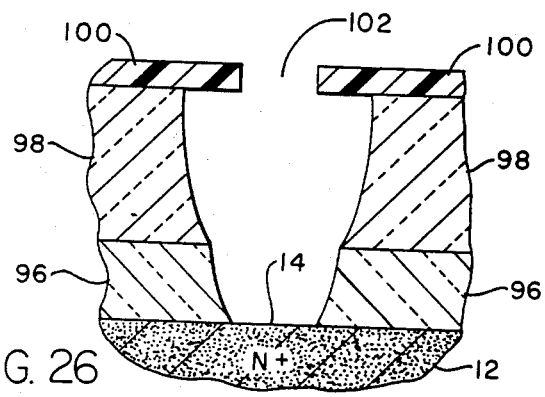
FIG. 26 is an enlarged view of a representative portion of FIG. 25.

A photoresist mask 100 is then formed over deposited oxide layer 98. Next, contact windows 102 are opened by etching through the portions of oxide layer 98 not covered by photoresist mask 100, and continuing to etch down through the underlying oxide layers 94 and 96 as shown in FIG. 25. While a certain amount of lateral etching undercuts photoresist layer 100 in the manner typical of FIG. 26, the amount of undercut is minimal due to the closely matched etching rates of the "high temperature" undoped oxide layer 98 and the underlying oxide layers 94 and 96. Accordingly, very small contacts may be produced by the present invention as will be seen below.

Figure 27:
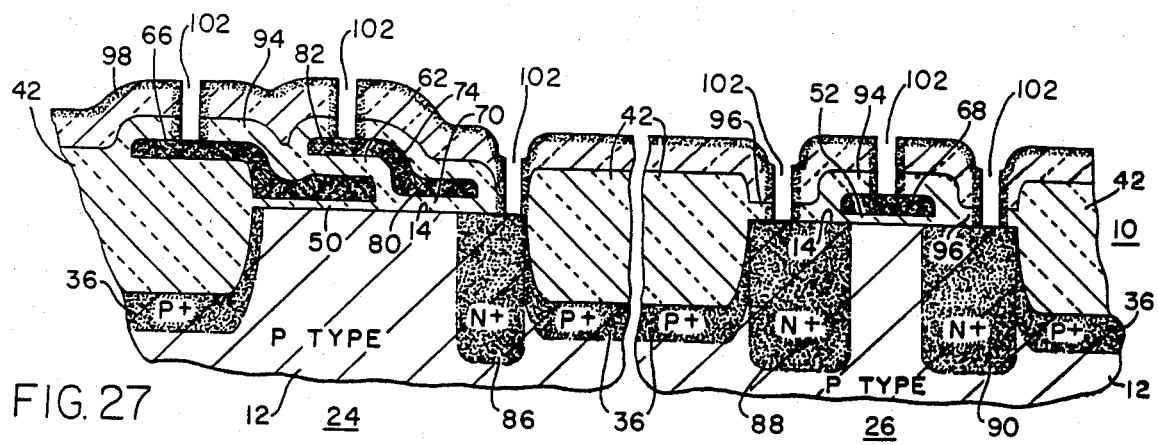
FIG. 27 is a schematic sectional view illustrating a succeeding step in the process.
Figure 28:
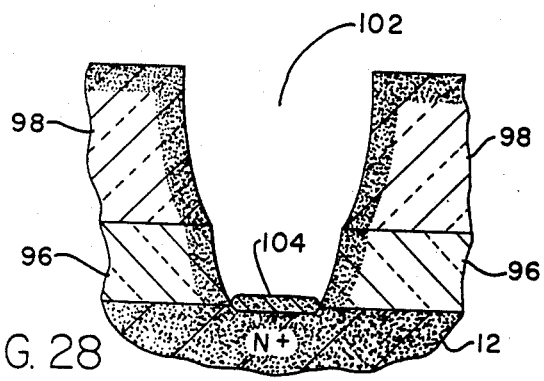
FIG. 28 is an enlarged view of a representative portion of FIG. 27.

Next, the photoresist layer 100 is removed, and a stabilization step is performed, preferably using a phosphorus diffusion, as indicated by the stippling along the exposed oxide surfaces shown in FIG. 27 and the enlarged view of FIG. 28. The phosphorus stabilization has the effect of producing very thin oxide layers 104 on exposed silicon surfaces (explicitly shown by way of example in FIG. 28) which are approximately 20 to 100 Angstroms thick.

It is convenient to getter the device 10 concurrently with stabilization, which may be achieved by covering all but the backside (i.e., the bottom surface of the substrate 12 with oxide thereon, not shown) with photoresist after opening windows 102, then stripping the backside down to clean silicon. Stabilization then proceeds as described in the preceding paragraph by removing the photoresist and exposing the device 10 to a phosphorus diffusion, which getters metallic impurities to the backside thereby favorably reducing leakage current.

Figure 29:
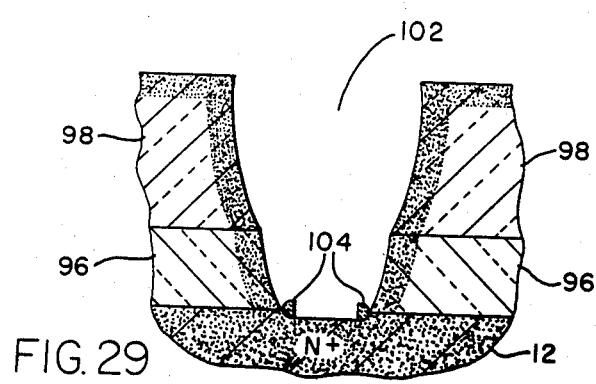
FIG. 29 is an enlarged view similar to the view of FIG. 28 illustrating a succeeding step in the process.

After the phosphorus stabilization step it is necessary to reopen contact windows 102 through oxide layers 104. A photoresist layer (not shown) is reapplied using the same mask registration which produced layer 100. Then, oxide layers 104 are etched through to the underlying silicon to reopen the contact windows 102, and the photoresist is removed to produce windows 102 typically illustrated by FIG. 29. The window opening 102 at surface 14 shown in FIG. 29 may be controlled to less than 5 microns in diameter, whereas known prior art processes were previously limited to about 8 microns.

Accordingly, it will be seen that the present invention provides a technique for making very small windows so that contacts may be positioned with precision therein. This important feature of the invention is achieved by the above sequence of steps in which the windows are etched through undoped oxide layers prior to stabilization. The process described herein has been found to permit a reduction in the surface area allocated to contacts by about 40% over the best known prior art.

Figure 30:
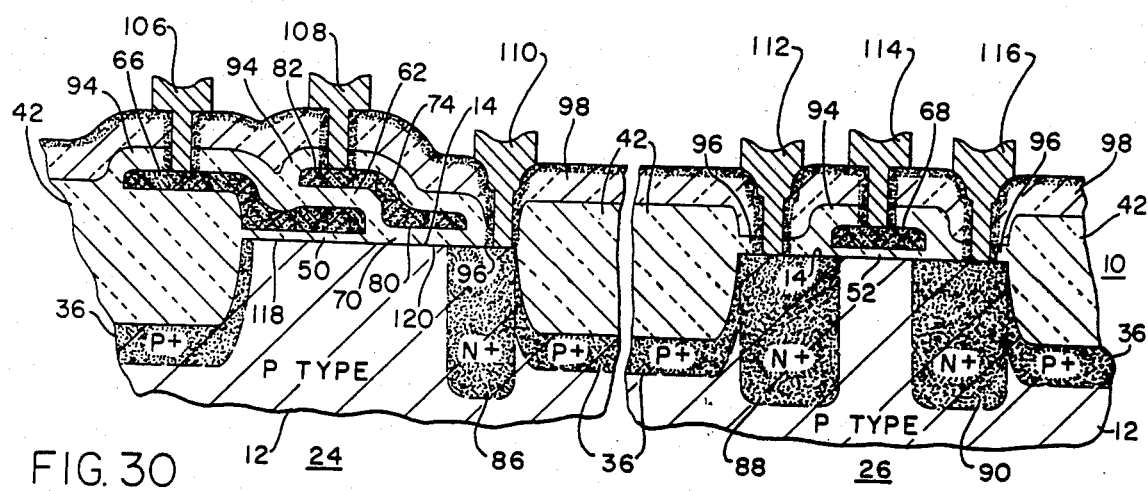
FIG. 30 is a schematic sectional view illustrating important features of the device at a final stage in the process.

Finally, a metallization process is used to form contacts 106, 108, 110, 112, 114 and 116 in the windows 102 which yields the device structure 10 shown in FIG. 30. The contacts are preferably formed by vacuum deposition of aluminum, photomasking portions of the aluminum, and etching the unmasked portions with etchants which selectively attack the aluminum but not the underlying oxide layer 98.

Those skilled in the art will recognize the utility of the element structures shown in FIG. 30, wherein the element in site 24 serves as charge storage cell or memory cell and the element in site 26 serves as a field-effect transistor.

In particular, the element 26 is a N-channel enhancement mode FET having a self-aligned silicon gate similar to that which is described in Mai et al., cited above, wherein contact 114 serves as a gate contact to silicon gate 68 and contacts 112 and 116 serve as source and drain contacts to regions 88 and 90. The present invention may also be applied to make N-channel depletion mode FETs as well as both modes of P-channel FETs by modification of the process steps specifically recited herein in accordance with the teachings of Mai et al.

The element 24 is a small area memory cell of the destructive readout type known in the art, having a single transistor and a single capacitor. A complementary memory cell may be produced having conductivity types opposite to those specifically shown in site 24 of FIG. 30 as will be appreciated by those skilled in the art.

The operation of a memory cell such as the cell 24 of FIG. 30 is known in the art. Briefly, contact 106 is biased with a voltage sufficient to hold a charge of minority carriers in the substrate 12 in an area 118 along the surface 14 to which conductive polysilicon layer 66 is in close proximity. In circuit analogy, a capacitor is formed by oxide layer 50 serving as a dielectric between the polysilicon layer 66 and the charge storage area 118 in juxtaposition thereunder. The presence or absence of a charge in storage area 118 represents binary information, which may be both sensed and altered through region 86 and contact 110 whenever a gate signal is applied to contact 108. A gate signal applied to contact 108 having a sufficiently high voltage known in the art will be carried by conductive polysilicon layer 74 thereby inducing a channel in substrate 12 along an area 120 near surface 14 immediately under oxide layer 70. Such an induced channel in the area 120 permits electrical communication between data transmission region 86 and the charge storage area 118. The area 120 is the circuit equivalent of a channel region in a FET, which in this embodiment is an N-channel enhancement mode FET. Therefore the memory cell 24 may be viewed as comprising a single transistor and a single capacitor in basic function, ignoring as negligible any incidental capacitances and resistances of the structure.

An advantage of the process steps of the present invention involves the formation of insulating layers 50, 62 and 70 having varying thicknesses which are important to proper device functioning. As discussed above, the inventive process successfully achieves a relatively thin oxide layer 50 having a preferred thickness of about 900 Angstroms, a slightly thicker oxide layer 70 having a preferred thickness of about 1,500 to 2,000 Angstroms, and a substantially thicker oxide layer 62 having a thickness in excess of 3000 Angstroms. Ideally, layer 62 should be as thick as possible to render negligible any parasitic capacitance existing between polysilicon layers 66 and 74. Since layer 62 is polyoxide grown from the 6,000 Angstroms deposit of polysilicon which produced layer 66, the thickness of layer 62 is limited as a practical matter to a maximum of about 8,000 Angstroms, which still leaves a sufficient thickness of polysilicon for layer 66. In present commercial embodiments, layer 62 is about 4,000 Angstroms, while a thickness of 3,000 and 6,000 Angstroms is acceptable.

From the foregoing description, taken with the drawings, it will be apparent that the present invention has broad applicability to commercial semiconductor devices. In particular, the presently described process has great utility in the manufacture of high density RAMs, and has facilitated the manufacture of a "16 K RAM" (i.e., a random-access memory device having 16,384 memory cells).

Although a preferred embodiments of the invention has been described in detail, it is to be understood that various changes, substitutions and alterations can be made therein without departing from the spirit and scope of the invention as defined by the appended claims.

What is claimed is:

1. A method for making a portion of a semiconductor device comprising the steps of:
   (a) forming an oxide insulating layer on a surface of a semiconductor substrate,
   (b) forming a polysilicon layer on a selected portion of the oxide insulating layer,
   (c) selectively etching away portions of the oxide insulating layer using the polysilicon layer as a mask, thereby exposing a surface portion of the substrate previously covered by the oxide insulating layer, and thereby incidentally partially undercutting the polysilicon layer by lateral etching of portions of the oxide insulating layer under a peripheral edge of the polysilicon layer such that the depth of the undercutting is equal to or greater than the thickness of the oxide insulating layer,
   (d) diffusing dopants into the substrate through the exposed substrate portion, and
   (e) exposing the substrate to an oxidizing ambient simultaneously to oxidize both the peripheral edge of the polysilicon layer and the exposed substrate surface portion adjoining the lateral undercut region, such that the lateral undercut region is filled by a substrate oxide component and a peripheral edge polysilicon layer oxide component as both oxide components expand and grow in response to the oxidizing ambient.

2. The method of claim 1 further comprising the step (f) following step (e) of depositing a redundant oxide layer over the device.

3. The method of claim 1 wherein the polysilicon layer is diffused with dopants in step (d) simultaneously with the diffusion of dopants into the substrate, thereby making the polysilicon layer highly conductive.

4. The method of claim 1 wherein the polysilicon layer forms a gate of a memory cell.

5. The method of claim 1 wherein the polysilicon layer forms a gate of a field-effect transistor.

* * * * *

REEXAMINATION CERTIFICATE (4038th)

United States Patent [19]
Chan et al.

[11] B1 4,553,314
[45] Certificate Issued    Apr. 18, 2000

[54] METHOD FOR MAKING A SEMICONDUCTOR DEVICE

[75] Inventors: Tsiu C. Chan, Carrollton; Chao Mai; Myint Hswe, both of Dallas, all of Tex.

[73] Assignee: SGS-Thomson Microelectronics, Inc., Carrollton, Tex.

Reexamination Requests:
No. 90/003,191, Sep. 10, 1993
No. 90/003,240, Nov. 1, 1993
No. 90/003,430, May 12, 1994
No. 90/003,874, Jul. 5, 1995

Reexamination Certificate for:
Patent No.:  4,553,314
Issued:      Nov. 19, 1985
Appl. No.:   06/431,527
Filed:       Sep. 30, 1982

Related U.S. Application Data

[62] Division of application No. 06/351,726, Feb. 24, 1982, abandoned, which is a continuation of application No. 06/100,606, Dec. 5, 1979, abandoned, which is a division of application No. 06/002,426, Jan. 10, 1979, abandoned, which is a continuation of application No. 05/762,398, Jan. 26, 1977, abandoned.

[51] Int. Cl.[7] ................................................. H01L 21/22
[52] U.S. Cl. .......................... 438/250; 438/906; 438/303; 438/595; 438/265
[58] Field of Search ..................................... 438/257, 265, 438/301, 303, 585, 595, 770, 250, 906

[56] References Cited

U.S. PATENT DOCUMENTS

| | | | |
|---|---|---|---|
| 3,244,555 | 4/1966 | Adam et al. | 117/212 |
| 3,397,448 | 8/1968 | Tucker | 29/577 |
| 3,549,437 | 12/1970 | Steppberger et al. | 156/4 |
| 3,705,419 | 12/1972 | Bleher et al. | 317/235 R |
| 3,764,865 | 10/1973 | Napoli et al. | 317/235 R |
| 3,775,191 | 11/1973 | McQuhae | 148/1.5 |
| 3,798,752 | 3/1974 | Fujimoto | 29/571 |
| 3,865,654 | 2/1975 | Chang et al. | 437/41 |
| 3,880,684 | 4/1975 | Abe | 156/8 |
| 3,906,620 | 9/1975 | Anazi et al. | |
| 3,921,283 | 11/1975 | Shappir | 29/571 |
| 3,972,756 | 8/1976 | Nagase et al. | 156/17 |

FOREIGN PATENT DOCUMENTS

| | | |
|---|---|---|
| 48-49382 | 7/1973 | Japan. |
| 49-66074 | 6/1974 | Japan. |
| 51-118392 | 10/1976 | Japan. |
| 1428713 | 3/1976 | United Kingdom. |

OTHER PUBLICATIONS

H. Abe et al., "Etching Characteristics of Silicon and Its Compounds by Gas Plasma", Japan J. Appl. Phys., vol. 12, No. 1 (1973).

J.R. Devaney et al., "Plasma Etching PROMS and Other Problems," Solid State Technology, vol. 17, No. 12, Dec. 1974, pp. 46–50.

*Primary Examiner*—M. Wilczewski

[57] ABSTRACT

A method for making a semiconductor device is described in which overlapping polycrystalline silicon layers are deposited over selected portions of a semiconductor substrate and insulated from the substrate and from each other, thereby providing an improved semiconductor device for use in a random-access memory integrated circuit.

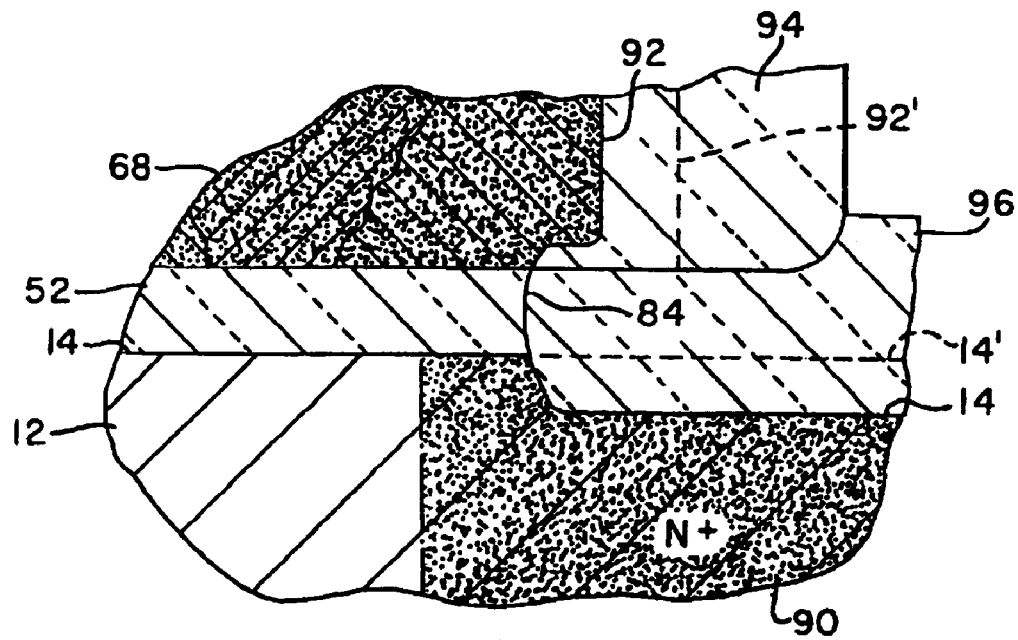

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–5 is confirmed.

New claims 6–15 are added and determined to be patentable.

*6. A method for making a portion of an enhancement mode field-effect transistor semiconductor device having a structure which prevents short circuits caused by lateral etching of oxide under a peripheral edge of a polysilicon layer, said method comprising the steps of:*

*(a) forming an oxide insulating layer on a surface of a semiconductor substrate,*

*(b) forming a polysilicon layer on a selected portion of the oxide insulating layer,*

*(c) selectively etching away portions of the oxide insulating layer using the polysilicon layer as a mask, thereby exposing a surface portion of the substrate previously covered by the oxide insulating layer, and thereby incidentally partially undercutting the polysilicon layer by lateral etching of portions of the oxide insulating layer under a peripheral edge of the polysilicon layer such that the depth of the undercutting is equal to or greater than the thickness of the oxide insulating layer,*

*(d) diffusing dopants into the substrate through the exposed substrate portion, and*

*(e) thereafter exposing the substrate to an oxidizing ambient simultaneously to oxidize both the peripheral edge of the polysilicon layer and the exposed substrate surface portion adjoining the lateral undercut region, such that the lateral undercut region is filled by a substrate oxide component and a peripheral edge polysilicon layer oxide component as both oxide components expand and grow in response to the oxidizing ambient, each to a thickness greater than the thickness of the oxide insulating layer.*

*7. The method of claim 6 further compromising the step (f) following step (e) of depositing a redundant oxide layer over the device.*

*8. The method of claim 6 wherein the polysilicon layer is diffused with dopants in step (d) simultaneously with the diffusion of dopants into the substrate, thereby making the polysilicon layer highly conductive.*

*9. The method of claim 6 wherein the polysilicon layer forms a gate of a memory cell.*

*10. The method of claim 6 wherein the polysilicon layer forms a gate of a field-effect transistor.*

*11. A method for making a portion of an enhancement mode field-effect transistor semiconductor device comprising the steps of:*

*(a) forming an oxide insulating layer on a surface of a semiconductor substrate,*

*(b) forming a polysilicon layer on a selected portion of the oxide insulating layer,*

*(c) selectively etching away portions of the oxide insulating layer using the polysilicon layer as a mask, thereby exposing a surface portion of the substrate previously covered by the oxide insulating layer, and thereby incidentally partially undercutting the polysilicon layer by lateral etching of portions of the oxide insulating layer under a peripheral edge of the polysilicon layer such that the depth of the undercutting is equal to or greater than the thickness of the oxide insulating layer,*

*(d) diffusing dopants into the substrate through the exposed substrate portion, and*

*(e) exposing the substrate to an oxidizing ambient simultaneously to oxidize both the peripheral edge of the polysilicon layer and the exposed substrate surface portion adjoining the lateral undercut region, such that the lateral undercut region is filled by a substrate oxide component and a peripheral edge polysilicon layer oxide component as both oxide components expand and grow in response to the oxidizing ambient, each to a thickness which is at least one and one-third times the thickness of the oxide insulating layer.*

*12. The method of claim 11 further comprising the step (f) following step (e) of depositing a redundant oxide layer over the device.*

*13. The method of claim 11 wherein the substrate oxide component and the polysilicon layer oxide component are each grown to a thickness of about 2000 Angstroms.*

*14. The method of claim 11 wherein the oxide insulating layer is grown to a thickness of at least about 1500 Angstroms.*

*15. The method of claim 11 wherein the oxide insulating layer is grown to a thickness of at least about 900 Angstroms.*

\* \* \* \* \*